United States Patent
Drizlikh et al.

(10) Patent No.: US 7,504,340 B1
(45) Date of Patent: Mar. 17, 2009

(54) SYSTEM AND METHOD FOR PROVIDING CONTACT ETCH SELECTIVITY USING RIE LAG DEPENDENCE ON CONTACT ASPECT RATIO

(75) Inventors: Sergei Drizlikh, Scarborough, ME (US); Thomas John Francis, South Portland, ME (US); Lee James Jacobson, Cape Elizabeth, ME (US)

(73) Assignee: National Semiconductor Corporation, Santa Clara, CA (US)

(*) Notice: Subject to any disclaimer, the term of this patent is extended or adjusted under 35 U.S.C. 154(b) by 176 days.

(21) Appl. No.: 10/866,914

(22) Filed: Jun. 14, 2004

(51) Int. Cl.
*H01L 21/302* (2006.01)

(52) U.S. Cl. .......... 438/700; 438/712; 438/714; 438/743; 216/59

(58) Field of Classification Search ......... 438/10, 438/700, 714, 712, 743; 216/59
See application file for complete search history.

(56) References Cited

U.S. PATENT DOCUMENTS

| | | | | |
|---|---|---|---|---|
| 5,689,432 | A * | 11/1997 | Blaauw et al. | 716/18 |
| 6,297,163 | B1 * | 10/2001 | Zhu et al. | 438/707 |
| 6,632,321 | B2 * | 10/2003 | Lill et al. | 156/345.24 |
| 2002/0056913 | A1 * | 5/2002 | Eimori | 257/758 |
| 2003/0136762 | A1 * | 7/2003 | Zhao et al. | 216/59 |
| 2004/0023499 | A1 * | 2/2004 | Hellig et al. | 438/694 |

OTHER PUBLICATIONS

Tan et al., Modeling and simulation of the lag effect in a deep reactive ion etching process, Oct. 20, 2006, Journal of Micromechanics and Microengineering, vol. 16, pp. 2570-2575.*
Chung, Geometrical pattern effect on silicon deep etching by an inductively coupled plasma system, Feb. 6, 2004, Journal of Micromechanics and Microengineering, vol. 14, pp. 656-662.*
Jansen et al., Microelectronic Engineer, "RIE Lag in High Aspect Ratio Trench Etching of Silicon", pp. 45-50, 1997.*
Tsung-Kuan A. Chou et al., "Fabrication of Out-Of-Plane Curved Surfaces in SI by Utilizing RIE Lag", 2002 IEEE, pp. 145-148.
N. Aoi et al., "Contact Hole Etch Scaling Toward 0.1 μm", pp. 216-217.
Y.H. Liu et al., "Contact Size Dependence of Highly Selective Self-Aligned Contact Etching with Polymer Formation and Its Mechanism", 2000 IEEE/SEMI Advanced Semiconductor Manufacturing Conference, pp. 153-156.

* cited by examiner

*Primary Examiner*—Binh X Tran

(57) ABSTRACT

A system and method is disclosed for providing contact etch selectivity for the etching of a plurality of contact etch holes through a dielectric layer of an integrated circuit. The method comprises the steps of obtaining a value of the reactive ion etch (RIE) lag for the dielectric layer, and selecting different values for the diameters of the contact etch holes based upon the desired depths of the contact etch holes and on the value of the RIE lag for the dielectric layer. The invention also comprises a contact diameter application processor that is capable of using RIE lag data to calculate contact diameters for contact etch holes for a mask design layout of an integrated circuit.

16 Claims, 4 Drawing Sheets

SYSTEM AND METHOD FOR PROVIDING CONTACT ETCH SELECTIVITY USING RIE LAG DEPENDENCE ON CONTACT ASPECT RATIO

TECHNICAL FIELD OF THE INVENTION

The present invention is generally directed to manufacturing technology for etching contact holes in semiconductor devices and, in particular, to a system and method for providing contact etch selectivity using reactive ion etch (RIE) lag dependence on contact aspect ratio.

BACKGROUND OF THE INVENTION

During the manufacture of a semiconductor device it is usually necessary to etch contact holes through an insulating dielectric layer of the device down to the underlying active or passive elements of the device. The etching of the contact holes creates vias in the dielectric layer. Metal is then placed in the vias. The metal filled vias are used to connect the underlying active or passive elements of the semiconductor device to external leads.

The bottom layer in a semiconductor device will usually be made of salicide, silicon or polysilicon. The process of etching contact holes through an overlying dielectric layer requires high etch selectivity between the dielectric layer and the bottom layer. This is due to the contact height difference between various elements of the semiconductor device. For example, the contact height for a gate of a semiconductor transistor will be different than the contact height for the source/drain of the semiconductor device. High etch selectivity between the dielectric layer and the bottom layer is especially required for devices that have additional structures at a polysilicon level (e.g., polysilicon capacitors).

Reactive ion etch (RIE) lag is a well-known phenomenon that causes the etch rate of a contact etch hole to decrease as the etch process continues to etch the contact etch hole deeper and deeper. The aspect ratio of a contact etch hole is the ratio of its depth to its width. As a contact etch hole is etched deeper and deeper, the aspect ratio increases. In RIE lag the magnitude of the decrease in etch rate is proportional to the increase in magnitude of the aspect ratio. In prior art methods the presence of RIE lag is undesirable. Therefore prior art methods are directed toward the minimization of RIE lag.

Prior art methods sometimes provide contact etch selectivity by using stop etch layers such as salicide or silicon oxynitride (SiON). A stop etch layer is placed at a desired depth where the contact etch process is to end. The etch process stops when the etch process reaches the stop etch layer. The stop etch layer prevents overetch and breakthrough when the etch process etches down to the underlying active element of the semiconductor device. A stop etch layer is usually a few hundred Angstroms thick. An Angstrom is one tenth of a nanometer. (1 Å=$10^{-10}$ m).

Consider a prior art etch process that etches each of a plurality of contact etch holes to a different depth in a dielectric layer. Each of the contact etch holes have the same diameter and therefore are etched at the same rate. After the first contact etch hole (i.e., the shallowest contact etch hole) reaches its underlying stop etch layer, the etch process continues. In the time period during which the prior art etch process is etching the second contact etch hole (i.e., the next shallowest contact etch hole) down to its desired depth, the prior art etch process in the first contact etch hole is laterally etching the sides of the first contact etch hole. The presence of stop etch layer at the bottom of the first contact etch hole laterally channels the prior art etch process to etch the sides of the first contact etch hole. The prior art etch process therefore causes the first contact etch hole to have a final diameter that is larger than desired.

To solve this problem and to correct other similar deficiencies in prior art methods, there is a need in the art for an improved system and method for providing contact etch selectivity when contact etch holes are etched through a dielectric layer in a semiconductor device.

SUMMARY OF THE INVENTION

To address the deficiencies of the prior art, it is an object of the present invention to provide a system and method for providing contact etch selectivity using reactive ion etch (RIE) lag dependence on contact aspect ratio.

When contact etch holes are etched through a dielectric layer of an integrated circuit, the size of the diameters of the contact etch holes must first be selected. In the method of the present invention a value of the reactive ion etch (RIE) lag for the dielectric layer is first obtained. The value of the reactive ion etch (RIE) lag is empirically determined. Then different values for each of the diameters of the contact etch holes are calculated based upon the desired depths of the contact etch holes and on the value of the RIE lag for the dielectric layer. The shallowest contact etch holes have the smallest contact diameters and the deepest contact etch holes have the largest contact diameters.

An etch process is applied to etch the contact etch holes through the dielectric layer of the integrated circuit. As the etch process etches the contact etch holes, the RIE lag causes the etch rate in each contact etch hole to be different. This is because the aspect ratio of each of the contact etch holes is different. The sizes of the diameters of the contact etch holes are chosen so that the etch rate for each contact etch hole (as modified by its respective value of RIE lag) will cause each of the contact etch holes to reach its respective desired depth in the dielectric layer at approximately the same time.

The invention also comprises a contact diameter application processor that is capable of using mask design layout information and RIE lag data to calculate the diameters of a plurality of contact etch holes for a mask design layout of an integrated circuit.

It is an object of the present invention to provide a system and method for providing contact etch selectivity when contact etch holes are etched through a dielectric layer in a semiconductor device.

It is also an object of the present invention to provide a system and method for providing contact etch selectivity using reactive ion etch (RIE) lag dependence on contact aspect ratio.

It is yet another object of the present invention to provide a system and method for determining different diameters of a plurality of contact etch holes so that each contact etch hole will reach its respective desired depth in the dielectric layer at approximately the same time.

It is still another object of the present invention to provide a contact diameter application processor that is capable of using mask design layout information and RIE lag data to calculate the diameters of a plurality of contact etch holes for a mask design layout of an integrated circuit.

The foregoing has outlined rather broadly the features and technical advantages of the present invention so that those skilled in the art may better understand the detailed description of the invention that follows. Additional features and advantages of the invention will be described hereinafter that form the subject of the claims of the invention. Those skilled in the art should appreciate that they may readily use the conception and the specific embodiment disclosed as a basis for modifying or designing other structures for carrying out the same purposes of the present invention. Those skilled in the art should also realize that such equivalent constructions do not depart from the spirit and scope of the invention in its broadest form.

Before undertaking the Detailed Description of the Invention below, it may be advantageous to set forth definitions of certain words and phrases used throughout this patent document: the terms "include" and "comprise," as well as derivatives thereof, mean inclusion without limitation; the term "or," is inclusive, meaning and/or; the phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like; and the term "controller" means any device, system or part thereof that controls at least one operation, such a device may be implemented in hardware, firmware or software, or some combination of at least two of the same. It should be noted that the functionality associated with any particular controller may be centralized or distributed, whether locally or remotely. Definitions for certain words and phrases are provided throughout this patent document, those of ordinary skill in the art should understand that in many, if not most instances, such definitions apply to prior uses, as well as future uses, of such defined words and phrases.

BRIEF DESCRIPTION OF THE DRAWINGS

For a more complete understanding of the present invention and its advantages, reference is now made to the following description taken in conjunction with the accompanying drawings, in which like reference numerals represent like parts.

DETAILED DESCRIPTION OF THE INVENTION

FIGS. 1 through 7, discussed below, and the various embodiments used to describe the principles of the present invention in this patent document are by way of illustration only and should not be construed in any way to limit the scope of the invention. Those skilled in the art will understand that the principles of the present invention may be implemented in any type of suitably arranged semiconductor device.

Figure 1:
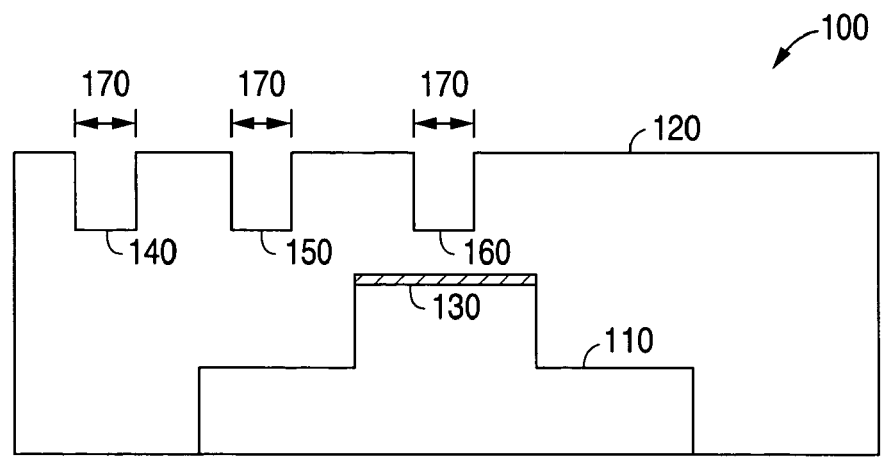
FIG. 1 illustrates a cross sectional view of a prior art semiconductor device showing three exemplary contact etch holes in which each contact etch hole has the same diameter.

FIG. 1 illustrates a cross sectional view of a prior art semiconductor device 100. Prior art semiconductor device 100 comprises a bottom layer 110 covered by dielectric layer 120. Bottom layer 110 comprises various active and passive elements (not shown in detail) located at different levels of the semiconductor device 100. An exemplary stop etch layer 130 is shown on a top surface of one portion of bottom layer 110. FIG. 1 also shows three exemplary contact etch holes 140, 150, 160 in which each contact etch hole has the same contact diameter 170. By way of numerical example, contact diameter 170 may be one fourth of a micron (0.25 µm). A micron is one millionth of a meter ($10^{-6}$ m).

In the prior art method illustrated in FIG. 1 each contact etch hole 140, 150, 160 has the same contact diameter 170. As the prior art etch process continues to etch the contact etch holes, 140, 150, 160, the prior art method attempts to minimize the RIE lag.

Figure 2:
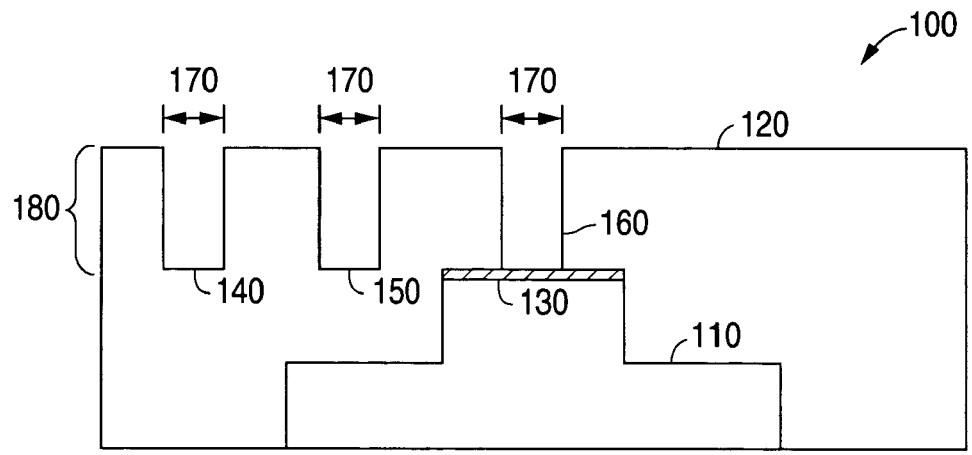
FIG. 2 illustrates a cross sectional view of the prior art semiconductor device shown in FIG. 1 showing that the three exemplary contact etch holes each have an identical depth when the most shallow contact etch hole reaches its destination depth.

FIG. 2 illustrates another cross sectional view of the prior art semiconductor device 100 shown in FIG. 1. In this cross sectional view the contact etch process has continued until contact etch hole 160 has reached stop etch layer 130. As shown in FIG. 2, each of the three exemplary contact etch holes 140, 150, 160 have an identical depth 180 when the most shallow contact etch hole 160 reaches stop etch layer 130. This is because the etch rate for each of the contact etch holes 140, 150, 160 is the same. The aspect ratio for each of the contact etch holes 140, 150, 160 is also the same. The RIE lag is the same for each contact etch hole 140, 150, 160.

The prior art etch process continues to etch contact etch holes, 140, 150, 160. In the time period during which the prior art etch process is etching contact etch hole 150 down to the bottom layer 110, the prior art etch process in contact etch hole 160 is laterally etching the sides of contact etch hole 160 (not shown). The presence of stop etch layer 130 at the bottom of contact etch hole 160 laterally channels the prior art etch process to etch the sides of contact etch hole 160. The prior art etch process causes contact etch hole 160 to have a final diameter that is larger than desired.

To avoid this problem of the prior art etch process, it would be desirable if each contact etch hole 140, 150, 160 reached its desired depth at the same time. To achieve this result, the present invention provides contact etch selectivity by using different contact diameters for each contact etch hole. The method of the present invention uses the dependence of the RIE lag on the aspect ratio of each of the contact etch holes. The shallowest contact etch holes have the smallest contact diameters and the deepest contact etch holes have the largest contact diameters. Unlike prior art etch processes, the method of the present invention maximizes the RIE lag.

Figure 3:
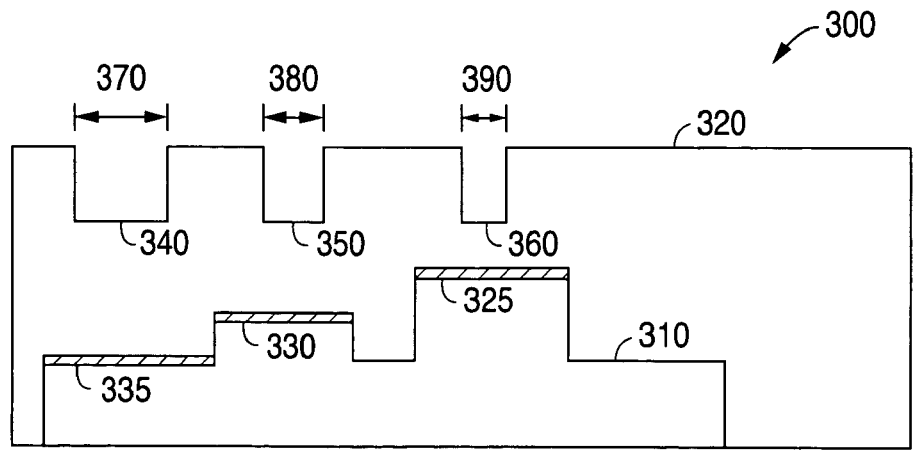
FIG. 3 illustrates a cross sectional view of a semiconductor device manufactured in accordance with the principles of the present invention showing three exemplary contact etch holes in which each contact etch hole has a different diameter.

For example, FIG. 3 illustrates a cross sectional view of a semiconductor device manufactured in accordance with the principles of the present invention. The semiconductor device 300 comprises a bottom layer 310 covered by dielectric layer 320. Bottom layer 310 comprises various active and passive elements (not shown in detail) located at different levels of the semiconductor device 300. An exemplary stop etch layer 325 is shown on a top surface of first portion of bottom layer 310. An exemplary stop etch layer 330 is shown on a top surface of second portion of bottom layer 310. An exemplary stop etch layer 335 is shown on a top surface of third portion of bottom layer 310.

FIG. 3 also shows three exemplary contact etch holes 340, 350, 360 in which each contact etch hole has a different contact diameter. The largest contact etch hole 340 has a contact diameter 370. The next smallest contact etch hole 350 has a contact diameter 380. Contact diameter 380 of contact etch hole 350 is smaller than contact diameter 370 of contact etch hole 340. The smallest contact etch hole 360 has a contact diameter 390. Contact diameter 390 of contact etch hole 360 is smaller than contact diameter 380 of contact etch hole 350.

By way of numerical example, contact diameter 370 may be twenty eight hundredths of a micron (0.28 μm). Contact diameter 380 may be twenty four hundredths of a micron (0.24 μm). Contact diameter 390 may be twenty hundredths of a micron (0.20 μm). A micron is one millionth of a meter ($10^{-6}$ m).

In the method of the present invention illustrated in FIG. 3 each contact etch hole 340, 350, 360 has a different contact diameter. The different sizes of the contact diameters 370, 380, 390 are selected based on a known rate of RIE lag for the dielectric 320. As the etch process continues to etch the contact etch holes, 340, 350, 360, through dielectric 320, the RIE lag causes the etch rate in each contact etch hole 340, 350, 360 to be different. This is because the aspect ratio of each of the contact etch holes 340, 350, 360 is different. The sizes of the contact diameters 370, 380, 390 are chosen so that the etch rate for each contact etch hole (as modified by its respective value of RIE lag) will cause each of the contact etch holes to reach its respective desired depth at approximately the same time.

Figure 4:
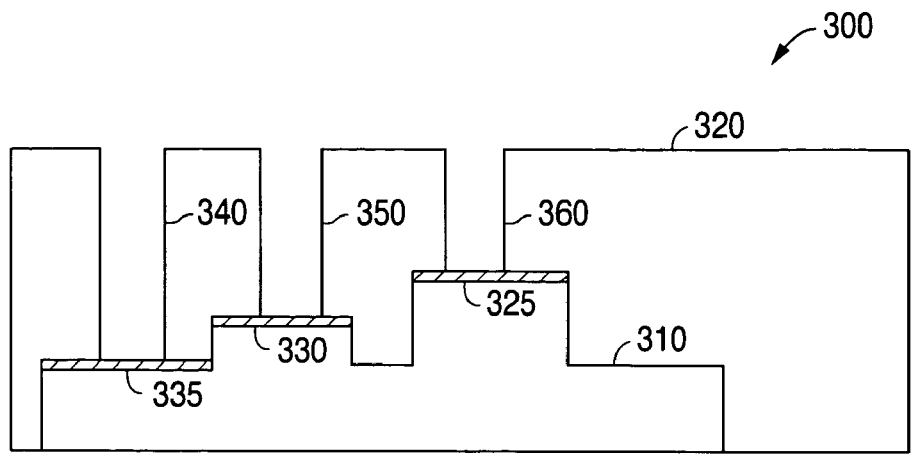
FIG. 4 illustrates a cross sectional view of the semiconductor device shown in FIG. 3 showing that the three exemplary contact etch holes each have a different depth when the most shallow contact etch hole reaches its destination depth.

FIG. 4 illustrates another cross sectional view of the semiconductor device 300 shown in FIG. 3. In this cross sectional view the contact etch process has continued until (1) contact etch hole 340 has reached stop etch layer 335, and (2) contact etch hole 350 has reached stop etch layer 330, and (3) contact etch hole 360 has reached stop etch layer 325. Due to the RIE lag phenomenon the three different etch processes occur at different etch rates but reach their respective desired depth at the same time.

As shown in FIG. 4, each of the three exemplary contact etch holes 340, 350, 360 have different depths. This is because the effective etch rate for each of the contact etch holes 340, 350, 360 varies in proportion to the aspect ratio of its respective contact etch hole. Unlike the prior art method, the aspect ratio for each of the contact etch holes 340, 350, 360 not the same. This is because, as previously described, the respective contact hole diameters 370, 380, 390 have been chosen so that the RIE lag for each of the contact etch holes 340, 350, 360 will cause each of the contact etch holes to reach its respective desired depth at approximately the same time.

The magnitude of RIE lag for a given material can be determined empirically. In addition, for each type of material it is possible to establish a correlation that relates the contact diameter of a contact etch hole, the desired depth of the contact etch hole, and the etch rate through the material. For example, given a particular type of dielectric material (e.g., silicon dioxide), a desired value for a contact diameter for a contact etch hole may be determined from the desired value of depth and the etch rate. The etch rate takes the RIE lag phenomenon into account using the desired aspect ratio (i.e., the ratio of the desired depth to the desired width) of the contact etch hole.

In one advantageous embodiment of the principles of the present invention, the empirically determined RIE lag data may be used to automatically calculate contact etch hole diameters for mask design layout software. There are a number of different types of prior art mask design layout software packages. An example of a prior art mask design layout software package is the MaskRigger™ software package manufactured by ASML Mask Tools, Inc.

The empirically determined RIE lag data of the present invention describes (for each type of dielectric material) the relationship between the contact hole diameter, the contact hole depth, and the etch rate. The empirically determined RIE lag data of the present invention is provided to a contact diameter application processor (to be described more fully below). The contact diameter application processor is capable of calculating various contact diameters for each contact etch hole drawn on a mask design layout for every type of contact. The calculation of a contact diameter usually needs to be made only once for each type of contact. The contact diameter application processor of the present invention is described with reference to FIG. 5 and FIG. 6 below.

Figure 5:
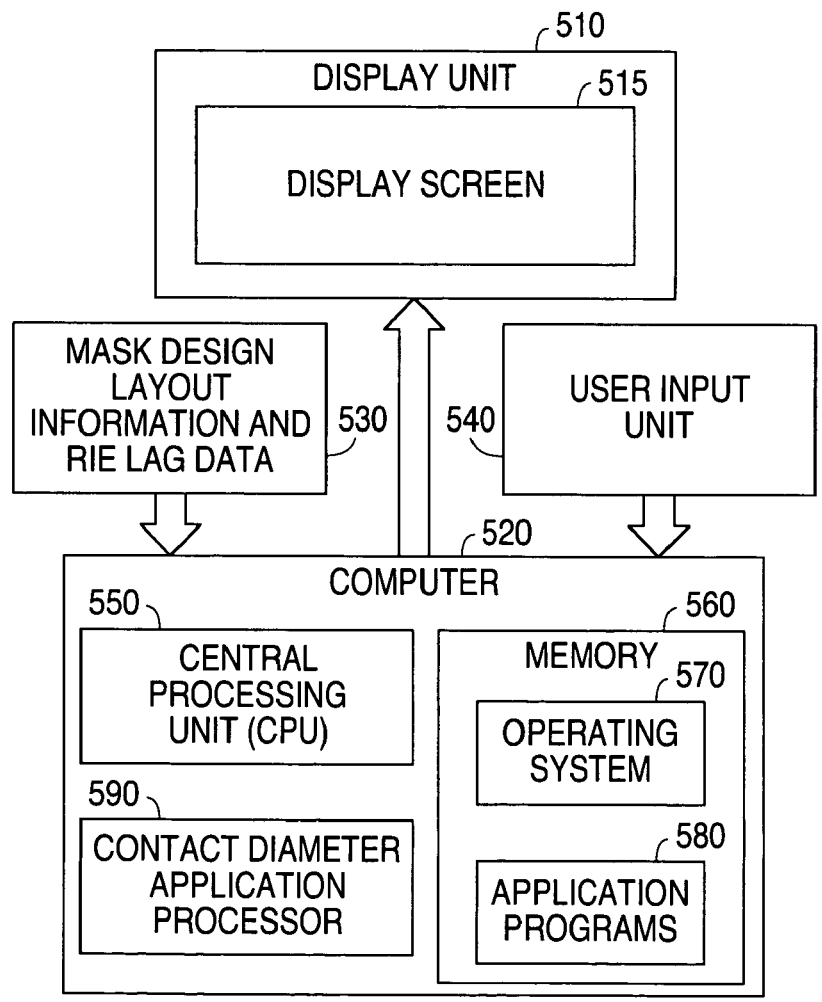
FIG. 5 is a block diagram illustrating a display unit and an exemplary computer comprising a contact diameter application processor in accordance with the principles of the present invention.

FIG. 5 is a block diagram illustrating a display unit 510 that has a display screen 515 and an exemplary computer 520 that comprises contact diameter application processor 590 in accordance with the principles of the present invention. Computer 520 receives design layout information and RIE lag data from a source 530 of design layout information and RIE lag data. Computer 520 also receives user input signals from user input unit 540. User input unit 540 may comprise any conventional source of user input signals (e.g., keyboard, mouse, computer disk files).

Computer 520 comprises a central processing unit (CPU) 550 and memory 560. Memory 560 comprises operating system software 570 and application programs 580. Computer 520 also comprises contact diameter application processor 590 of the present invention. For convenience in description, the structure and operation of contact diameter application processor 590 will be described as a unit that is separate from CPU 550 and memory 560. It is understood, however, that contact diameter application processor 590 may access and utilize the facilities of CPU 550 and memory 560 within computer 520 in order to carry out the method of the present invention.

As previously described, contact diameter application processor 590 receives RIE lag data and mask design layout information. Contact diameter application processor 590 uses the RIE lag data to calculate the various contact diameters for each contact etch hole drawn in the mask design layout. Contact diameter application processor 590 calculates the appropriate contact diameters for every type of contact and for differing types of dielectric material. Contact diameter application processor 590 provides the results of its calculations to the mask design layout software package. Contact diameter application processor 590 provides may also display the results of its calculations on display screen 515 of the display unit 510. Display unit 510 may comprise any conventional type of display unit (e.g., television, computer monitor, flat panel display screen).

Figure 6:
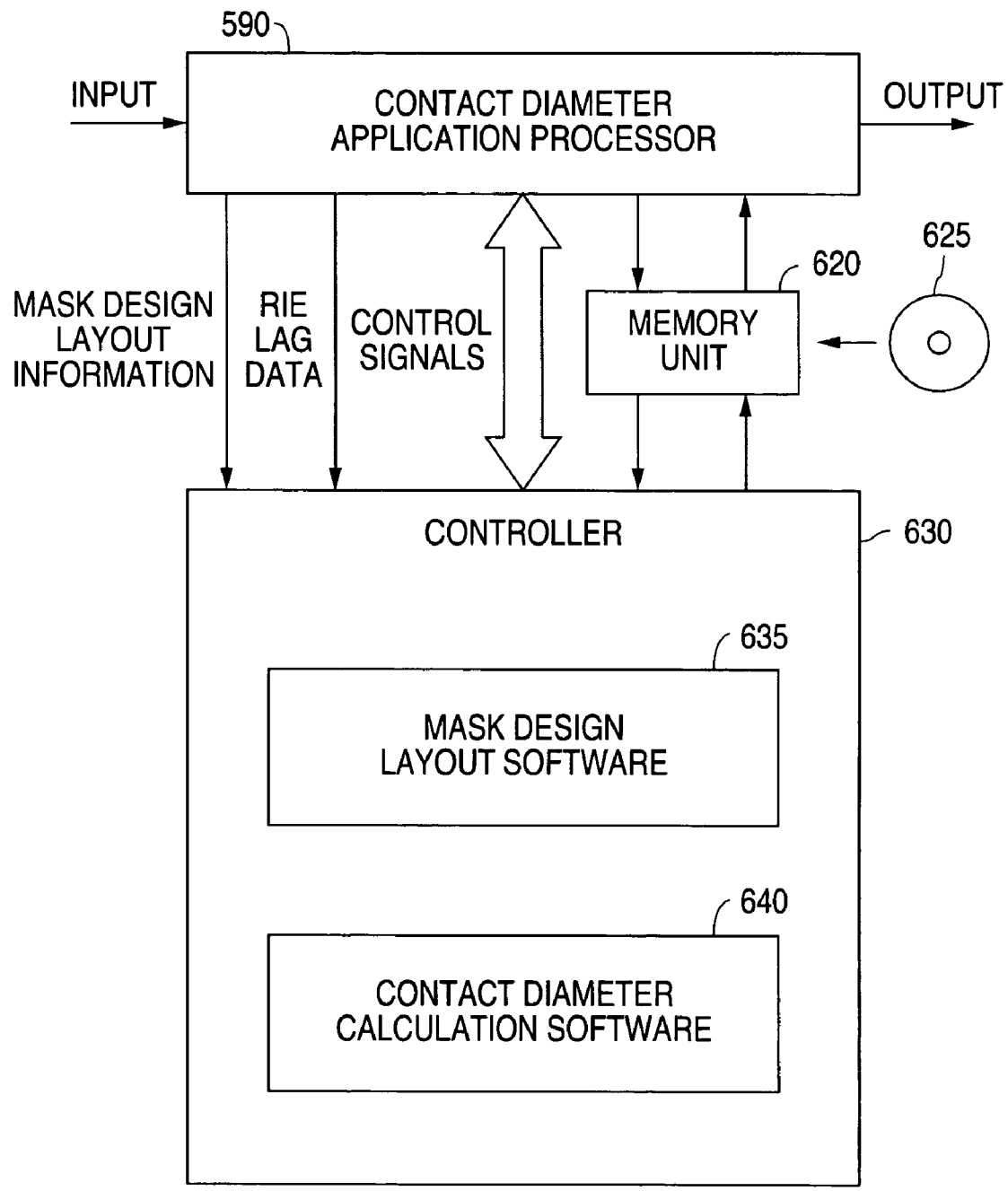
FIG. 6 is a block diagram illustrating in more detail the contact diameter application processor of the present invention.

FIG. 6 a block diagram illustrating contact diameter application processor 590 of the present invention in more detail. Contact diameter application processor 590 is capable of storing the RIE lag data and mask design layout information in memory unit 620. Contact diameter application processor 590 is also capable of storing the results of its calculations in memory unit 620. Memory unit 620 may comprise random access memory (RAM). Memory unit 620 may comprise a non-volatile random access memory (RAM), such as flash memory. Memory unit 620 may comprise a mass storage data device, such as a hard disk drive (not shown). Memory unit 620 may also comprise an attached peripheral drive or removable disk drive (whether embedded or attached) that reads read/write DVDs or re-writable CD-ROMs. As illustrated in FIG. 6, removable disk drives of this type are capable of receiving and reading re-writable CD-ROM disk 625.

Contact diameter application processor 590 provides the mask design layout information and the RIE lag data to controller 630. Controller 630 is also capable of receiving control signals from contact diameter application processor 590 and sending control signals to contact diameter application processor 590. Controller 630 is also coupled to contact diameter application processor 590 through memory unit 620.

As shown in FIG. 6, controller 630 comprises mask design layout software 635 and contact diameter calculation software 640. Contact diameter calculation software 640 comprises computer software that is capable of carrying out the method of the present invention.

Contact diameter application processor 590 comprises controller 630 and contact diameter calculation software 640. Controller 630 and contact diameter calculation software 640 together comprise a contact diameter application processor that is capable of carrying out the present invention.

Figure 7:
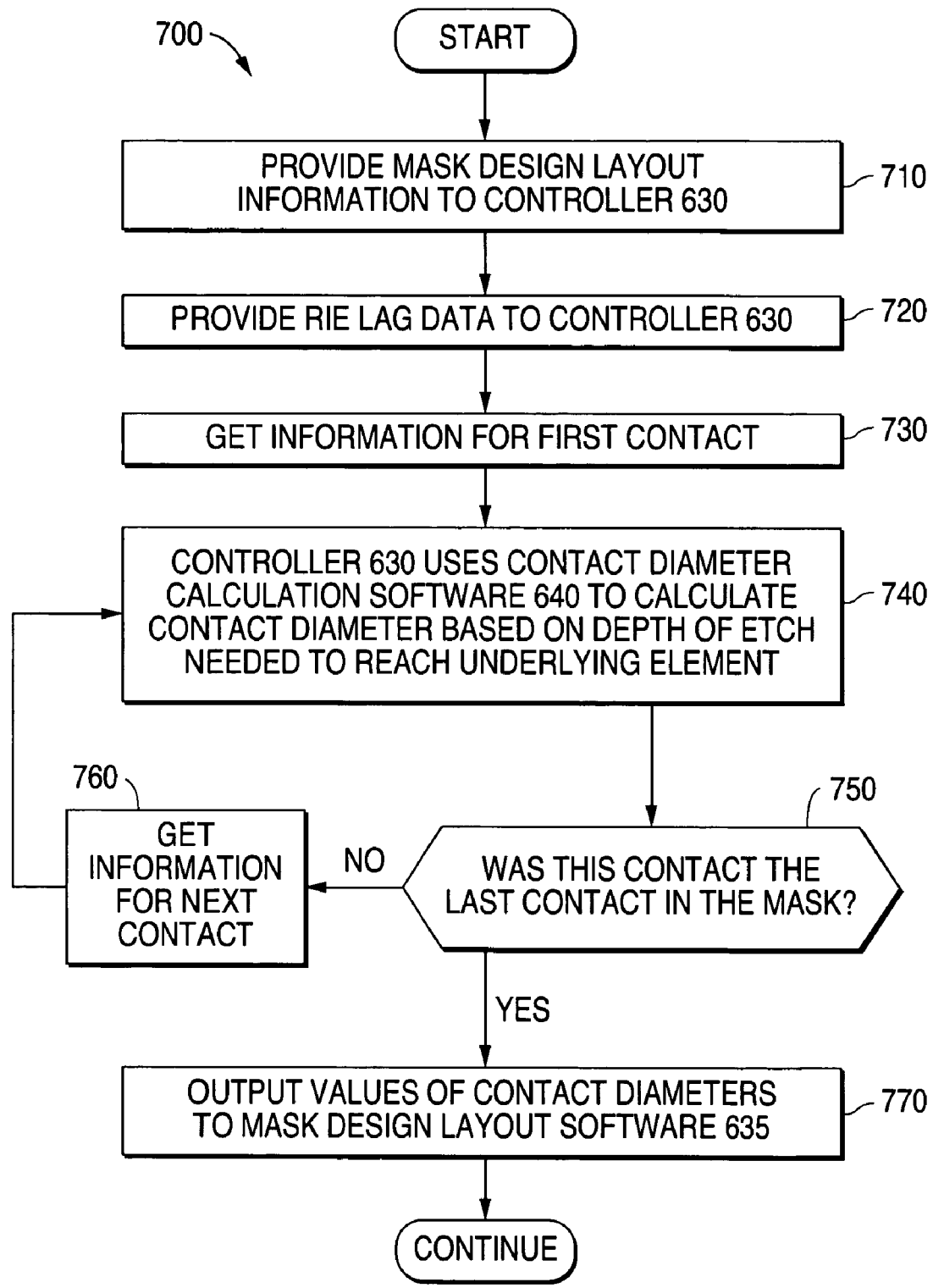
FIG. 7 illustrates a flow chart showing the steps of an advantageous embodiment of a method of the present invention.

FIG. 7 illustrates a flow chart 700 showing the steps of an advantageous embodiment of a method of the present invention. First mask design layout information is provided to controller 630 (step 710). Then RIE lag data is provided to controller 630 (step 720). Then controller 630 gets the mask design layout information and the RIE lag data for the first contact (step 730).

Then controller 630 uses the contact diameter calculation software 640 to calculate the contact diameter based on the depth of the etch needed to reach an underlying element (step 740). Then a determination is made whether the previous contact was the last contact in the mask (decision step 750). If the contact was not the last contact then controller 630 gets the mask design layout information and the RIE lag data for the next contact (step 760). Control then returns to step 740 and the contact diameter for the next contact is calculated (step 740).

If controller 630 determines that it has calculated the contact diameter for the last contact in the mask, then controller 630 outputs the values of the contact diameters to mask design layout software 635. In this manner controller 630 calculates the contact diameters for all of the contacts in the mask. Although the present invention has been described with an exemplary embodiment, various changes and modifications may be suggested to one skilled in the art. It is intended that the present invention encompass such changes and modifications as fall within the scope of the appended claims.

What is claimed is:

1. A method for providing contact etch selectivity for etching a contact etch hole through a dielectric layer of an integrated circuit, the method comprising the steps of:

obtaining an etch rate through the dielectric layer of the integrated circuit, the etch rate taking into account a reactive ion etch (RIE) lag value for the dielectric layer and a desired aspect ratio of the contact etch hole;

selecting a diameter value for the contact etch hole based on the etch rate, wherein selecting the diameter value comprises selecting a first diameter value for a first plurality of contact etch holes based on a first etch rate, the first etch rate taking into account the RIE lag value and a desired aspect ratio of the first plurality of contact etch holes, and selecting a second diameter value for a second plurality of contact etch holes based on a second etch rate, the second etch rate taking into account the RIE lag value and a desired aspect ratio of the second plurality of contact etch holes; and storing the selected diameter value for the contact etch hole in a memory.

2. The method as set forth in claim 1, further comprising the step of:

etching the contact etch hole through the dielectric layer of the integrated circuit, wherein the contact etch hole has a diameter that is equal to the selected diameter value.

3. The method as set forth in claim 1, wherein:

selecting the first diameter value is done so that each of the first plurality of contact etch holes is etched to a first desired depth when a time period ends; and selecting the second diameter value is done so that each of the second plurality of contact etch holes is etched to a second desired depth when the time period ends.

4. The method as set forth in claim 3, further comprising the steps of:

etching the first plurality of contact etch holes through the dielectric layer, wherein each of the first plurality of contact etch holes has a diameter that is equal to the selected first diameter value; and etching the second plurality of contact etch holes through the dielectric layer, wherein each of the second plurality of contact etch holes has a diameter that is equal to the selected second diameter value.

5. A method for providing contact etch selectivity for etching a contact etch hole through a dielectric layer of an integrated circuit, the method comprising the steps of:

obtaining a correlation that relates (i) a diameter of the contact etch hole, (ii) a desired depth of the contact etch hole, and (iii) an etch rate through the dielectric layer, wherein the etch rate takes into account a reactive ion etch (RIE) lag value for the dielectric layer and a desired aspect ratio of the contact etch hole;

selecting a diameter value for the contact etch hole based on the correlation, wherein selecting the diameter value comprises selecting a first diameter value for a first plurality of contact etch holes based on a first etch rate, the first etch rate taking into account the RIE lag value and a desired aspect ratio of the first plurality of contact etch holes, and selecting a second diameter value for a second plurality of contact etch holes based on a second etch rate, the second etch rate taking into account the RIE lag value and a desired aspect ratio of the second plurality of contact etch holes; and storing the selected diameter value for the contact etch hole in a memory.

6. The method as set forth in claim 5, further comprising the step of:

etching the contact etch hole through the dielectric layer of the integrated circuit, wherein the contact etch hole has a diameter that is equal to the selected diameter value.

7. The method as set forth in claim 5, wherein:

selecting the first diameter value is done so that each of the first plurality of contact etch holes is etched to a first desired depth when a time period ends; and selecting the second diameter value is done so that each of the second plurality of contact etch holes is etched to a second desired depth when the time period ends.

8. The method as set forth in claim 7, further comprising the steps of:

etching the first plurality of contact etch holes through the dielectric layer, wherein each of the first plurality of contact etch holes has a diameter that is equal to the selected first diameter value; and etching the second plurality of contact etch holes through the dielectric layer, wherein each of the second plurality of contact etch holes has a diameter that is equal to the selected second diameter value.

9. A method for providing contact etch selectivity for etching a contact etch hole through a dielectric layer of an integrated circuit, the method comprising the steps of:

empirically determining a reactive ion etch (RIE) lag value for the dielectric layer of the integrated circuit;

identifying an etch rate through the dielectric layer of the integrated circuit, the etch rate taking into account the RIE lag value and a desired aspect ratio of the contact etch hole;

selecting a diameter value for the contact etch hole based on the identified etch rate, wherein selecting the diameter value comprises selecting a first diameter value for a first plurality of contact etch holes based on a first etch rate, the first etch rate taking into account the RIE lag value and a desired aspect ratio of the first plurality of contact etch holes, and selecting a second diameter value for a second plurality of contact etch holes based on a second etch rate, the second etch rate taking into account the RIE lag value and a desired aspect ratio of the second plurality of contact etch holes; and providing the selected diameter value for the contact etch hole to a mask design layout tool.

10. The method as set forth in claim 9, further comprising the step of:

etching the contact etch hole through the dielectric layer of the integrated circuit, wherein the contact etch hole has a diameter that is equal to the selected diameter value.

11. The method as set forth in claim 9, wherein:

selecting the first diameter value is done so that each of the first plurality of contact etch holes is etched to a first desired depth when a time period ends; and selecting the second diameter value is done so that each of the second plurality of contact etch holes is etched to a second desired depth when the time period ends.

12. The method as set forth in claim 11, further comprising the steps of:

etching the first plurality of contact etch holes through the dielectric layer, wherein each of the first plurality of contact etch holes has a diameter that is equal to the selected first diameter value; and etching the second plurality of contact etch holes through the dielectric layer, wherein each of the second plurality of contact etch holes has a diameter that is equal to the selected second diameter value.

13. A method for providing contact etch selectivity for etching a contact etch hole through a dielectric layer of an integrated circuit, the method comprising the steps of:

obtaining a correlation that relates (i) a diameter of the contact etch hole, (ii) a desired depth of the contact etch hole, and (iii) an etch rate through the dielectric layer, wherein the etch rate takes into account an empirically-determined reactive ion etch (RIE) lag value for the dielectric layer and a desired aspect ratio of the contact etch hole;

selecting a diameter value for the contact etch hole based on the correlation, wherein selecting the diameter value comprises selecting a first diameter value for a first plurality of contact etch holes based on a first etch rate, the first etch rate taking into account the RIE lag value and a desired aspect ratio of the first plurality of contact etch holes and selecting a second diameter value for a second plurality of contact etch holes based on a second etch rate, the second etch rate taking into account the RIE lag value and a desired aspect ratio of the second plurality of contact etch holes; and providing the selected diameter value for the contact etch hole to a mask design layout tool.

14. The method as set forth in claim 13, further comprising the step of:

etching the contact etch hole through the dielectric layer of the integrated circuit, wherein the contact etch hole has a diameter that is equal to the selected diameter value.

15. The method as set forth in claim 13, wherein:

selecting the first diameter value is done so that each of the first plurality of contact etch holes is etched to a first desired depth when a time period ends; and selecting the second diameter value is done so that each of the second plurality of contact etch holes is etched to a second desired depth when the time period ends.

16. The method as set forth in claim 15, further comprising the steps of:

etching the first plurality of contact etch holes through the dielectric layer, wherein each of the first plurality of contact etch holes has a diameter that is equal to the selected first diameter value; and etching the second plurality of contact etch holes through the dielectric layer, wherein each of the second plurality of contact etch holes has a diameter that is equal to the selected second diameter value.

* * * * *